(12) United States Patent
Hasegawa et al.

(10) Patent No.: US 6,725,248 B1
(45) Date of Patent: Apr. 20, 2004

(54) DECIMATION FILTER AND SIGNAL PROCESSING METHOD USING THE SAME

(75) Inventors: Haruhiro Hasegawa, Koto-ku (JP); Kazunori Miyahara, Koto-ku (JP); Tatsunori Hashimoto, Inzai (JP); Shuichi Nagasawa, Tokyo (JP); Youichi Enomoto, Koto-ku (JP)

(73) Assignees: Hitachi, Ltd., Tokyo (JP); International Superconductivity Technology Center, Tokyo (JP); NEC Corporation, Tokyo (JP); Kabushiki Kaisha Toshiba, Kawasaki (JP)

( * ) Notice: Subject to any disclaimer, the term of this patent is extended or adjusted under 35 U.S.C. 154(b) by 599 days.

(21) Appl. No.: 09/654,090

(22) Filed: Sep. 1, 2000

(30) Foreign Application Priority Data

Sep. 6, 1999 (JP) ............................................. 11-251438

(51) Int. Cl.[7] ........................... G06F 17/17; G06F 17/10

(52) U.S. Cl. ...................................... 708/313; 708/319

(58) Field of Search ................................. 708/313, 319

(56) References Cited

U.S. PATENT DOCUMENTS 5,732,004 A * 3/1998 Brown ........................ 708/313
6,442,580 B1 * 8/2002 Machida ..................... 708/313

OTHER PUBLICATIONS

Lin et al, "Design of SFQ–Counting Analog–to–Digital Converter" IEEE Trans. on Applied Superconductivity, vol. 5, No. 2, Jun. 1995, pp. 2252–2259.*
Herr et al, High Speed Testing of a Four–Bit RSFQ Decimation Digtial Filter, IEEE Trans. on Applied Superconductivity, vol. 7, No. 2, Jun. 1997, pp. 2975–2978.*
Xie et al, Decimation Filter with Novel MVTL XOR Gate, IEEE Trans. on Applied Superconductivity, vol. 7, No. 2, Jun. 1997, pp. 2480–2483.*
Likharev et al., "RSFQ Logic/Memory Family: A New Josphosn–Junction Technology for Sub–Terahertz–Clock–Frequency Digital System", IEEE Trans. on Applied Superconductivity, vol. 1, No. 1, Mar. 1991, pp. 3–28.*
Dijkstra et al, "On the Use of Modulo Arithmetic Comb Filter in Sigma Delta Modulators," IEEE Proc. ICASSP '88, Apr. 1988, pp. 457–460.*

* cited by examiner

Primary Examiner—Tan V. Mai
(74) Attorney, Agent, or Firm—Antonelli, Terry, Stout & Kraus, LLP

(57) ABSTRACT

A decimation filter includes a first circuit block for respectively delaying by one clock an input signal synchronized with a clock signal and for producing a plurality of delayed signals, adders for adding or merging by confluence buffers the delayed signals to obtain total signals and for feeding the total signals to one signal line, and a second circuit block for counting pulses of the total signals. The filter provides an analog-to-digital converter which processes signals at a high speed and which is resistive against overflow.

16 Claims, 8 Drawing Sheets

DECIMATION FILTER AND SIGNAL PROCESSING METHOD USING THE SAME

BACKGROUND OF THE INVENTION

The present invention relates to a configuration of a decimation filter called "sinc filter" to process high-speed transmitting pulse signals.

Heretofore, configurations of a decimation filter including superconducting circuits have been described in various literature as follows. First to fourth examples of the prior art are described respectively in literature: J. X. Lin et al., Design of SFQ-Counting Analog-to-Digital Converter, IEEE Transactions on Applied Superconductivity, vol. 5, no. 2, June 1995, pp. 2252–2259; Q. P. Herr et al., High Speed Testing of a Four-Bit RSFQ Decimation Digital Filter, IEEE Transactions on Applied Superconductivity, vol. 7, no. 2, June 1997, pp. 2975–2978; Y. P. Xie et al., Decimation Filter with Novel MVTL XOR Gate, IEEE Transactions on Applied Superconductivity, vol. 7, no. 2, June 1997, pp. 2480–2483; K. K. Likharev et al., RSFQ Logic/Memory Family: A New Josephson-Junction Technology for Sub-Terahertz-Clock-Frequency Digital Systems, IEEE Transactions on Applied Superconductivity, vol. 1, no. 1, March 1991, PP. 3–28; and Dijkstra et al., On The Use Of Modulo Arithmetic Comb Filters In Sigma Delta Modulators, IEEE Proc. ICASSP '88, April 1988, pp. 457–460.

As shown in FIG. 6A of the first example, a sinc filter which is one type of decimation filters receives input signal $X_i$ transmitted with a period of one clock time and produces a sum with respect to subscript i assigned according to the clock signal as a unit of time. The sinc filter repeatedly executes the operation above.

When the operation is repeated k times a k-th order sinc filter is obtained. The prior art example shows a second order sinc filter. The filter of FIG. 6A includes a delay unit shown as "D cell", a non-destructive toggle flip-flop (TFF) circuit indicated as "NT cell", a destructive toggle flip-flop circuit indicated as "T1 cell", and a pulse splitter in which one signal line branches to two signal lines. This example employs a double-integration algorithm in which input signal $X_i$ is summed up with respect to subscript i to attain $v_n$, and then the value of $v_n$ is again summed up with respect to subscript n to obtain $y_i$. That is, the summation is conducted twice to perform a filter operation.

The destructive toggle flip-flop circuits (T1 cells) are connected in series to each other to form a counter of which a count value is reset to zero by a readout signal. This configuration further includes non-destructive toggle flip-flop circuits (NT cells). Since this prior art example includes various constituent elements such as T1 cells and NT cells, the circuit configuration is complicated, which hinders a high-speed operation. To achieve a higher operation, the circuit must be much more simplified in configuration.

As can be seen from expression (1) of the second prior art example, a decimation filter can be implemented as follows. An appropriate coefficient $c_i$ is multiplied by input signal $X_i$ and then a product from the multiplication is summed up with respect to subscript i assigned according to a clock signal as a unit of time. Therefore, various decimation filters can be implemented only by selecting appropriate coefficients $c_i$. Therefore, this method is advantageously used for general purposes.

However, as shown in FIG. 1 of the literature of the second prior art, the circuit configuration includes various circuit components such as a coefficient memory unit, a control unit, and an input/output interface. Namely, the circuit configuration is complex and of a large size, which hinders a high-speed operation of the circuit.

As shown in FIG. 5 of the literature of the third prior art example, this example is a second order sinc filter including two accumulators, one down-sampler, two differentiators. This system includes a reduced number of types of circuit components and hence has an advantage of a simple circuit construction. However, the accumulator includes a feedback section and conducts an arithmetic sum. Therefore it is required to perform a modulo arithmetic. Moreover, two accumulators are connected in cascade to each other that causes a large value obtained thereof and there arises a problem that the circuit size is also increased. Such large size of the circuit configuration hinders a high-speed operation.

SUMMARY OF THE INVENTION

It is therefore an object of the present invention to provide a decimation filter not including a feedback circuit which leads to undesired increase in the numeric value or undesired overflow.

Another object of the present invention is to provide a decimation filter which includes a reduced number of kinds of circuit components suitable for a high-speed operation and which does not include a feedback section.

To achieve the objects above in accordance with the present invention, there is provided a decimation filter including delay units for sequentially delaying an input signal one clock and for producing a plurality of delayed signals, adders for sequentially adding the delayed signals to each other and for producing total signal, and a counter connected to outputs from said adders for counting pulses of the total signals from said adders.

The adders may include a plurality of confluence buffers connected in series to each other for merging a plurality of signal lines into one signal line. The counter each can count pulses of the total signals during a period of time which is an integral multiple of a period of one clock signal. The counter may include a plurality of frequency multiplier (×1/2) circuits connected in series to each other.

According to one aspect of the present invention, the counter can produce a count value according to a readout signal inputted thereto during a period of time which is an integral multiple of a period of a clock signal and can be thereby set to a reset state.

The objects and features of the present invention will become more apparent from the consideration of the following detailed description taken in conjunction with the accompanying drawings.

DESCRIPTION OF THE EMBODIMENTS

Figure 1:
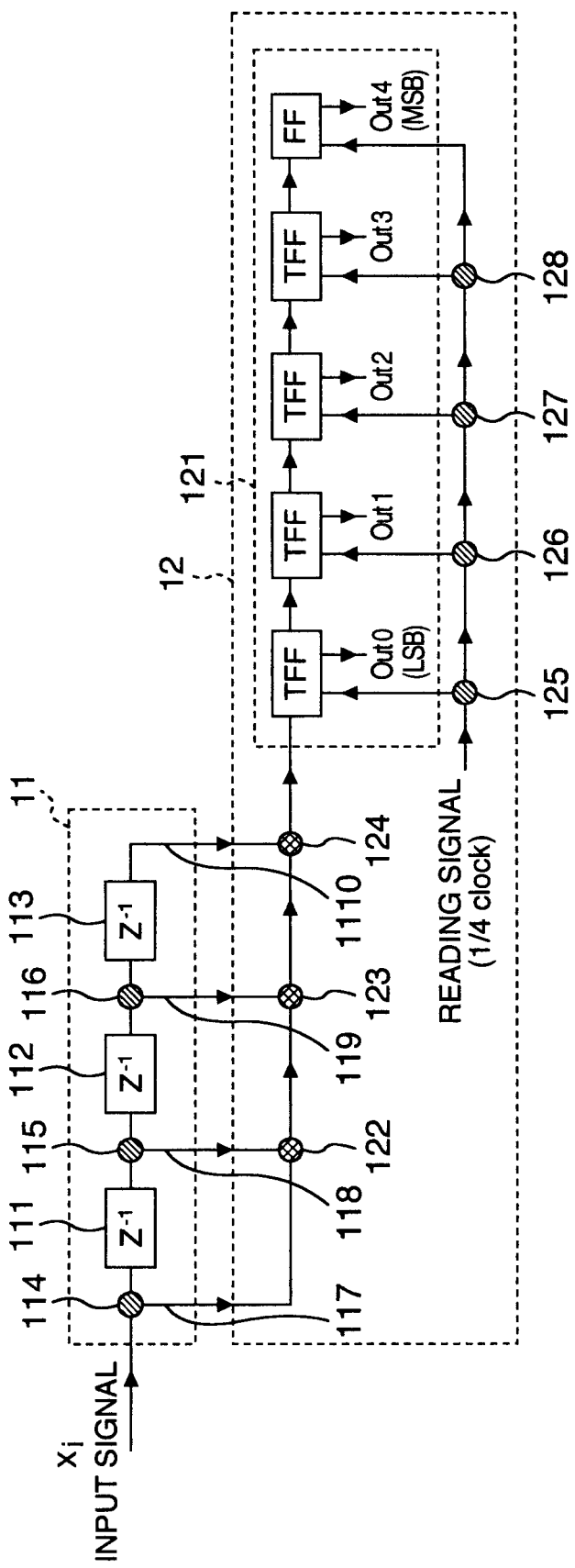
FIG. 1 is a circuit diagram showing constitution of a first embodiment of a decimation filter, i.e., a second order sinc filter with decimation factor N=4 in accordance with the present invention.

Description will be given in detail of embodiments of the present invention by referring to the drawings.

Embodiment 1

Referring first FIGS. 1, 5A to 5C, 6A and 6B, 7A and 7B, 8A and 8B, 9A to 9C, 10, and 11, description will be given of a first embodiment in accordance with the present invention. The first embodiment is an example of a second order sinc filter (k=2) with decimation factor N=4.

Having received pulse signal input $x_i$, this second order sinc filter produces $y_i'$ as a result of calculation as follows.

$$y_{i'} = (1/N^2) \sum_{j=i-(N-1)}^{i} \sum_{k=j-(N-1)}^{j} x_k \quad (1)$$

A term of $1/N^2$ is a constant in expression (1) and hence can be dispensed with in the first embodiment. It is assumed that the sinc filter produces $y_i$ as a result of calculation as follows.

$$y_i = \sum_{j=i-(N-1)}^{i} \sum_{k=j-(N-1)}^{j} x_k \quad (2)$$

For N=4, expression (2) is rendered to expression (3) as follows.

$$y_i = \sum_{j=i-3}^{i} (x_j + x_{j-1} + x_{j-2} + x_{j-3}) \quad (3)$$

(i=4n; n is an integer.)

As shown in FIG. 1, the decimation filter of the first embodiment includes a first circuit block 11 and a second circuit block 12 to conduct a filter operation as follows. Having received an input signal pulse, first circuit block 11 generates a plurality pulses $\{x_j\}$, $\{x_{j-1}\}$, $\{x_{j-2}\}$, and $\{x_{j-3}\}$ by delaying the input signal pulse respectively by an integral multiple of a clock signal. Second circuit block 12 collects or merges these pulses and counts the number of pulses during a period of the integral multiple of the clock signal, namely, counts the number of pulses from j=i−3 to j=i to resultantly obtain $y_i$.

Figure 7A:
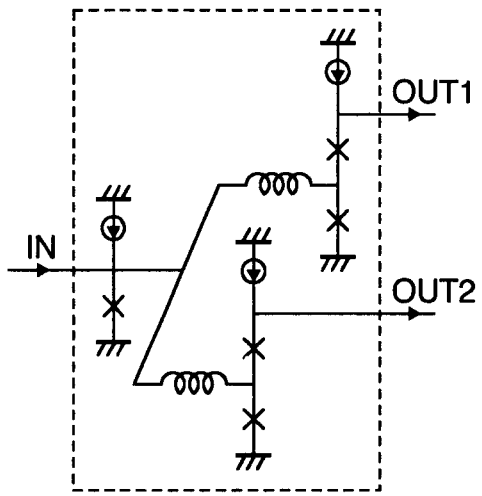
FIGS. 7A and 7B are circuit diagrams showing an equivalent circuit and a symbol of a pulse splitter of the first to fourth embodiments.
Figure 7B:
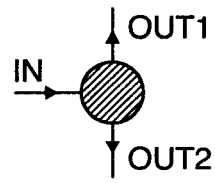

Specifically, the input signal is a pulse which is transmitted with a period of time according to the clock signal. The pulse is fed to a splitter 114 of first circuit block 11. FIGS. 7A and 7B show an equivalent circuit and a symbol of splitter 114. As can be seen from FIGS. 7A and 7B, splitter 114 includes a direct current (dc) bias current DC, Josephson junctions JJ (indicated by X), and inductors L. Splitter 114 produces two pulses. One of the pulses is fed via a line 117 and is delivered as pulse $\{x_j\}$ from first circuit block 11. This pulse is not delayed relative to the input signal pulse.

The other one of the pulses is inputted to a delay unit 111. FIG. 6 shows an equivalent circuit and a symbol of delay unit 111. The data signal inputted to delay unit 111 is once kept therein. When a subsequent clock signal is inputted to delay unit 111, the data signal is outputted therefrom. That is, the data signal is delayed by one clock. Delay unit 111 delivers the signal to a splitter 115. Like splitter 114, splitter 115 produces two pulses. One of the pulses is fed via a line 118 to be fed as pulse $\{x_{j-1}\}$ from first circuit block 11. This pulse is delayed one clock relative to the input signal pulse.

The other one of the pulses is inputted to a delay unit 112. Using a splitter 116 and a delay unit 113, a plurality of pulses are similarly delivered via signal lines 119 and 1110. First circuit block 11 therefore generates a plurality of pulses delayed respectively by an integral multiple of one clock, namely, $\{x_j\}$ not delayed relative to the input signal pulse, $\{x_{j-1}\}$ delayed one clock relative thereto, $\{x_{j-2}\}$ delayed two clocks relative thereto, and $\{x_{j-3}\}$ delayed three clocks relative thereto.

Figure 5A:
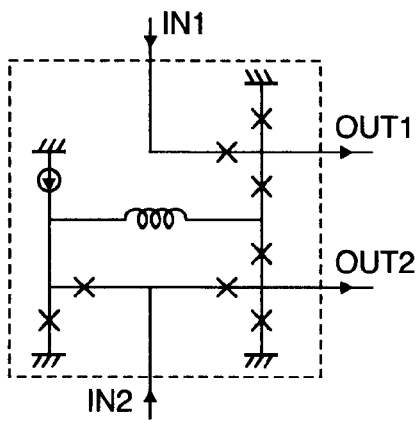
FIGS. 5A to 5C are circuit diagrams showing an equivalent circuit and a symbol of a toggle flip-flop circuit of the first to fourth embodiments.
Figure 5B:
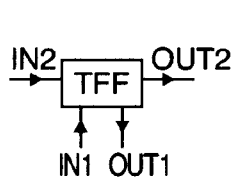
Figure 5C:
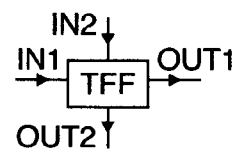
Figure 6A:
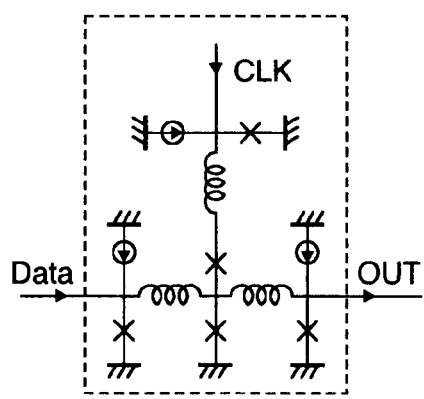
FIGS. 6A and 6B are circuit diagrams showing an equivalent circuit and a symbol of a delay unit of the first to fourth embodiments.
Figure 6B:
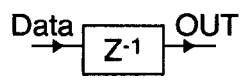
Figure 8A:
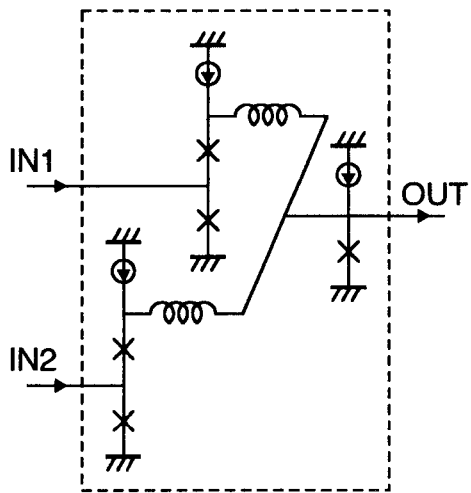
FIGS. 8A and 8B are circuit diagrams showing an equivalent circuit and a symbol of a confluence buffer of the first to fourth embodiments.
Figure 8B:
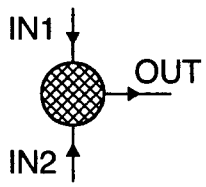

Second circuit block 12 gathers or merges these pulses to calculate a total of the pulses. Two pulses $\{x_j\}$ and $\{x_{j-1}\}$ are delivered via signal lines 117 and 118 to a confluence buffer 122 to be collected in one signal line. FIGS. 8A and 8B show an equivalent circuit and a symbol of confluence buffer 122. As shown in FIG. 8, confluence buffer 122 includes a dc bias current DC, Josephson junctions JJ, and inductors L. Pulse $\{x_{j-2}\}$ is added to the resultant signal by a confluence buffer 123 and pulse $\{x_{j-3}\}$ is further added thereto by a confluence buffer 124. Resultantly, pulses $\{x_j\}$, $\{x_{j-1}\}$, $\{x_{j-2}\}$, and $\{x_{j-3}\}$ from first circuit block 11 are collected on one signal line. The number of pulses transmitted on the signal line is counted by a counter 121. Since decimation factor N is four in the first embodiment, a reading signal is inputted to counter 121 at a period which is one quarter of the clock frequency. Namely, pulses on the signal line are counted at an interval of time which is four times that of the clock period. To input the reading signals, splitters 125 to 128 are employed. After the counter 121 outputs a result of counting operation, the count value thereof is reset to zero. This guarantees an appropriate count value for a next reading signal received. Counter 121 includes toggle flip-flops (TFFs) connected in series to each other and a flip-flop (FF), each of the toggle flip-flops being a frequency multiplier (×1/2). FIGS. 5A to 5C show an equivalent circuit and a symbol of the toggle flip-flip. Each time IN2 is inputted to the toggle flip-flop, the toggle flip-flop changes its state, i.e., from state "0" to state "1" and vice versa. That is, the toggle flip-flop is a frequency multiplier (×1/2) for input IN2. In state "1", when IN2 is inputted, "1" is outputted from OUT2. In state "1", when IN1 is inputted, "1" is outputted from OUT1 and then the state thereof is reset to state "0" (zero). Therefore, in operation of the toggle flip-flop, pulse signals to be counted are fed to IN2 and a reading signal is inputted to IN1.

Figure 9A:
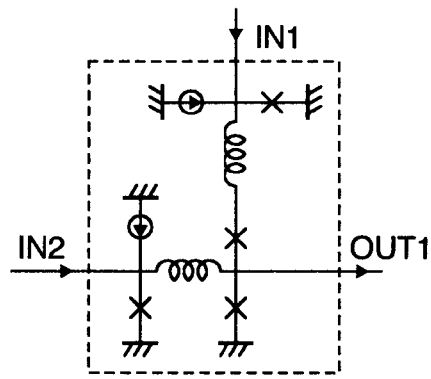
FIGS. 9A to 9C are circuit diagrams showing an equivalent circuit and a symbol of another flip-flop circuit of the first to fourth embodiments.
Figure 9B:
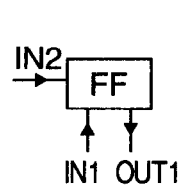
Figure 9C:
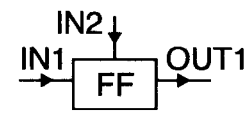

FIGS. 9A to 9C similarly show an equivalent circuit and a symbol of the flip-flop. When IN2 is inputted to the flip-flop in state "0", the flip-flop changes its state to state "1". When IN1 is inputted to the flip-flop in state "0", the flip-flop does not output any signal from OUT1 and state "0" is kept unchanged. When IN1 is inputted to the flip-flop in state "1", the flip-flop outputs "1" from OUT1 and is then reset to state "0". Consequently, pulse signals to be counted are fed to IN2 and a reading signal is supplied to IN1. Counter 121 includes toggle flip-flips above connected in series to each other and a flip-flip and hence conducts operation in which the count value is reset to zero after a result of counting is outputted in response to a reading signal.

The first embodiment is different from the first prior art example in which the total of input signal $x_i$ is directly twice calculated with respect to the subscript. In the first embodiment, after first circuit block 11 generates pulses $\{x_j\}$, $\{x_{j-1}\}$, $\{x_{j-2}\}$, and $\{x_{j-3}\}$ to be counted, second circuit block 12 merges the pulses together to count the pulses by executing operation of expression $$\left(3; \sum_{j=i-3}^{i}\right)$$

to resultantly obtain output $y_i$ $$\left(= \sum_{j=i-3}^{i}(x_j + x_{j-1} + x_{j-2} + x_{j-3})\right).$$

It is therefore possible to obtain a decimation filter including a reduced number of types of components such as toggle flip-flops, a flip-flip, delays, splitters, and confluence buffers. The filter does not include a feedback section to achieve an addition. This consequently leads to a decimation filter suitable for a high-speed operation.

Figure 10:
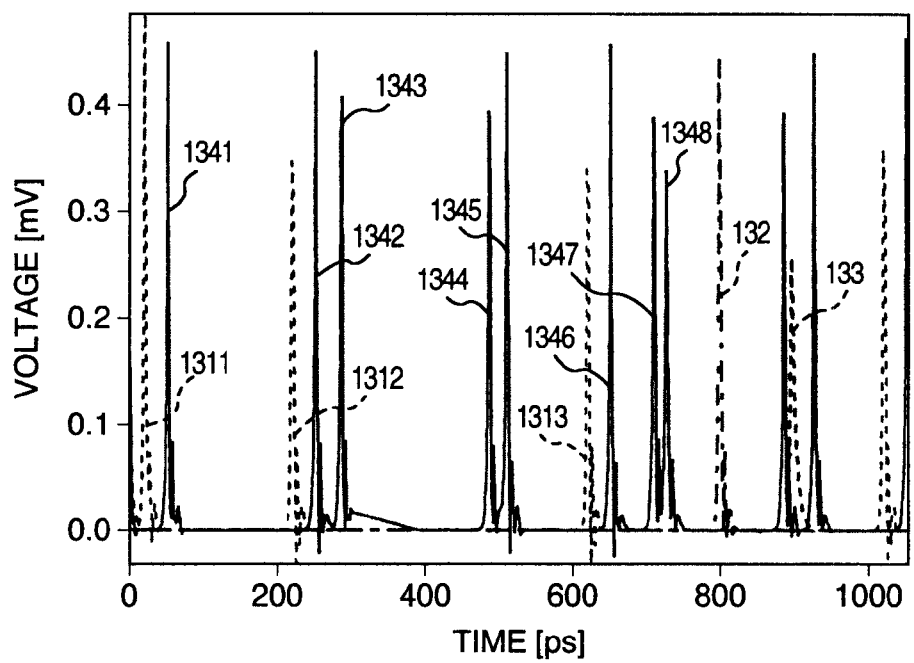
FIG. 10 is a graph showing waveforms of simulated operation of the third order sinc filter with decimation factor N=4 in the second embodiment of a decimation filter.

FIG. 10 shows waveforms of simulated operation in the first embodiment. The simulation uses a clock time of 200 picoseconds (ps) and input signals $x_i$ are inputted at a period of the clock time. In this example, $(x_1, x_2, x_3, x_4, x_5, x_6)=(1, 1, 0, 1, 0, 1)$, and $x_i=0 (i \leq 0)$. In FIG. 10, pulses 1311 to 1313 respectively correspond to $x_1$, $x_2$, and $x_4$ each having a value of one. Pulses 1341 to 1348 represent pulses measured at a position immediately after confluence buffer 124 of FIG. 1. Pulse 1341 corresponds to $x_1$ having passed signal line 117, and pulses 1342 and 1343 respectively correspond to $x_2$ having passed signal line 117 and $x_1$ having passed signal line 118 after a delay of one clock. Similarly, pulses 1344 and 1345 respectively correspond to $x_2$ having passed signal line 118 after a delay of one clock and $x_1$ having passed signal line 119 after a delay of two clocks. Pulses 1346 to 1348 respectively correspond to $x_4$ having passed signal line 117, $x_2$ having passed signal line 119 after a delay of two clocks, and $x_1$ having passed signal line 1110 after a delay of three clocks. Eight pulses 1341 to 1348 are appropriately inputted to counter 121.

The count value of counter 121 is read therefrom in response to a reading signal supplied thereto at a period which is four times that of the clock. This simulation uses a pulse 132 for the reading signal. At this point of time, counter 121 outputs an output pulse 133 from OUT3. OUT3 indicates that the count value is eight, namely, eight pulses have been inputted. It can be therefore confirmed that the operation has been correctly achieved.

Figure 11:
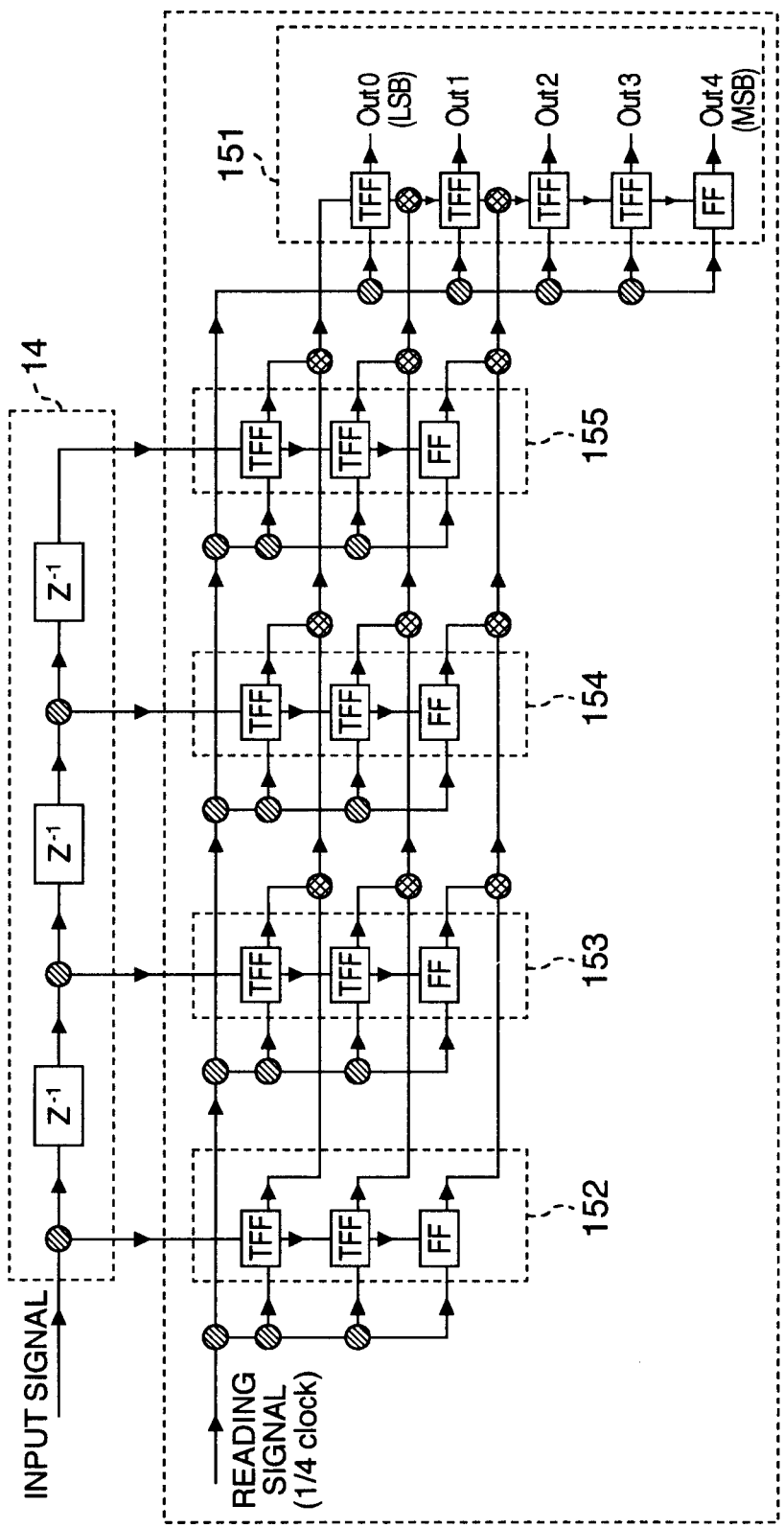
FIG. 11 is a circuit diagram showing constitution of a first embodiment of a decimation filter, i.e., a second order sinc filter with decimation factor N=4 in accordance with the present invention.

Although the pulses generated from first circuit block 11 are merged by confluence buffers 122 to 124 to count the total of the pulses by counter 121 in the first embodiment, it is also possible to obtain a similar result as shown in FIG. 11. The pulses generated from a first circuit block 14 are counted by counters 152 to 155 and the respective results of counting are added to each other by a counter 151 to obtain a total number of pulses.

Second Embodiment

Figure 2:
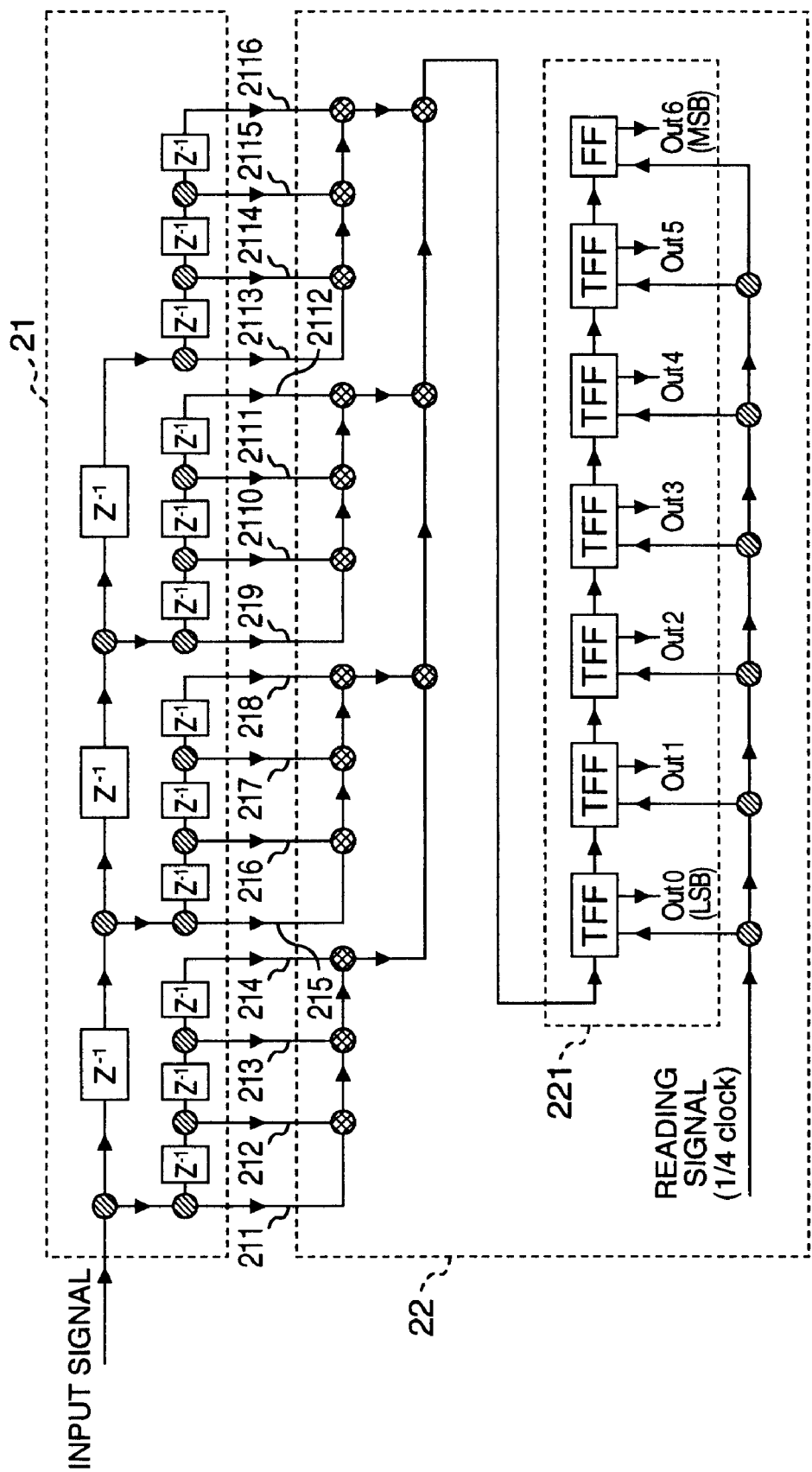
FIG. 2 is a circuit diagram showing constitution of a second embodiment of a decimation filter, i.e., a third order sinc filter with decimation factor N=4 in accordance with the present invention.

Referring now to FIG. 2, description will be given of a second embodiment of the present invention. This embodiment is an example of a third order sinc filter with decimation factor N=4.

Having received pulse signal input $x_i$, this third order sinc filter produces $y_i'$ as a result of calculation as follows.

$$y_i = \sum_{j=i-(N-1)}^{i} \sum_{k=j-(N-1)}^{j} \sum_{s=k-(N-1)}^{k} x_s \quad (4)$$

For N=4, expression (4) is represented as follows.

$$y_i = \sum_{j=i-3}^{i} \sum_{k=j-3}^{j} \left( x_k + x_{k-1} + x_{k-2} + x_{k-3} \right) \quad (5)$$

$$= \sum_{j=i-3}^{i} \{(x_j + x_{j-1} + x_{j-2} + x_{j-3}) +$$

$$(x_{j-1} + x_{j-2} + x_{j-3} + x_{j-4}) +$$

$$(x_{j-2} + x_{j-3} + x_{j-4} + x_{j-5}) +$$

$$(x_{j-3} + x_{j-4} + x_{j-5} + x_{j-6})\}$$

($i = 4n$; $n$ is an integer.)

Therefore, like in the first embodiment of FIG. 1, a first circuit block 21 includes delays and confluence buffers to generate 16 pulses each having a delay of an integral multiple of the clock relative to the input signal pulse, namely, $\{x_j\}$, $\{x_{j-1}\}$, $\{x_{j-2}\}$, $\{x_{j-3}\}$, $\{x_{j-1}\}$, $\{x_{j-2}\}$, $\{x_{j-3}\}$, $\{x_{j-4}\}$, $\{x_{j-2}\}$, $\{x_{j-3}\}$, $\{x_{j-4}\}$, $\{x_{j-5}\}$, $\{x_{j-3}\}$, $\{x_{j-4}\}$, $\{x_{j-5}\}$, and $\{x_{j-6}\}$.

These pulses are sequentially supplied via signal lines 211 and 2116 to a second circuit block 22 and are merged together to be counted by a counter 221. This achieves operation of a third order sinc filter with decimation factor N=4.

In the second embodiment, since merged pulses flow on one signal line, it is necessary to shift timing of the respectively pulses from each other. The second embodiment adjusts the timing by a wiring delay determined according to length of the signal line. However, the delay time may be elongated by inserting, for example, a Josephson transmission line in the transmission path to resultantly adjust the timing.

Third Embodiment

Figure 3:
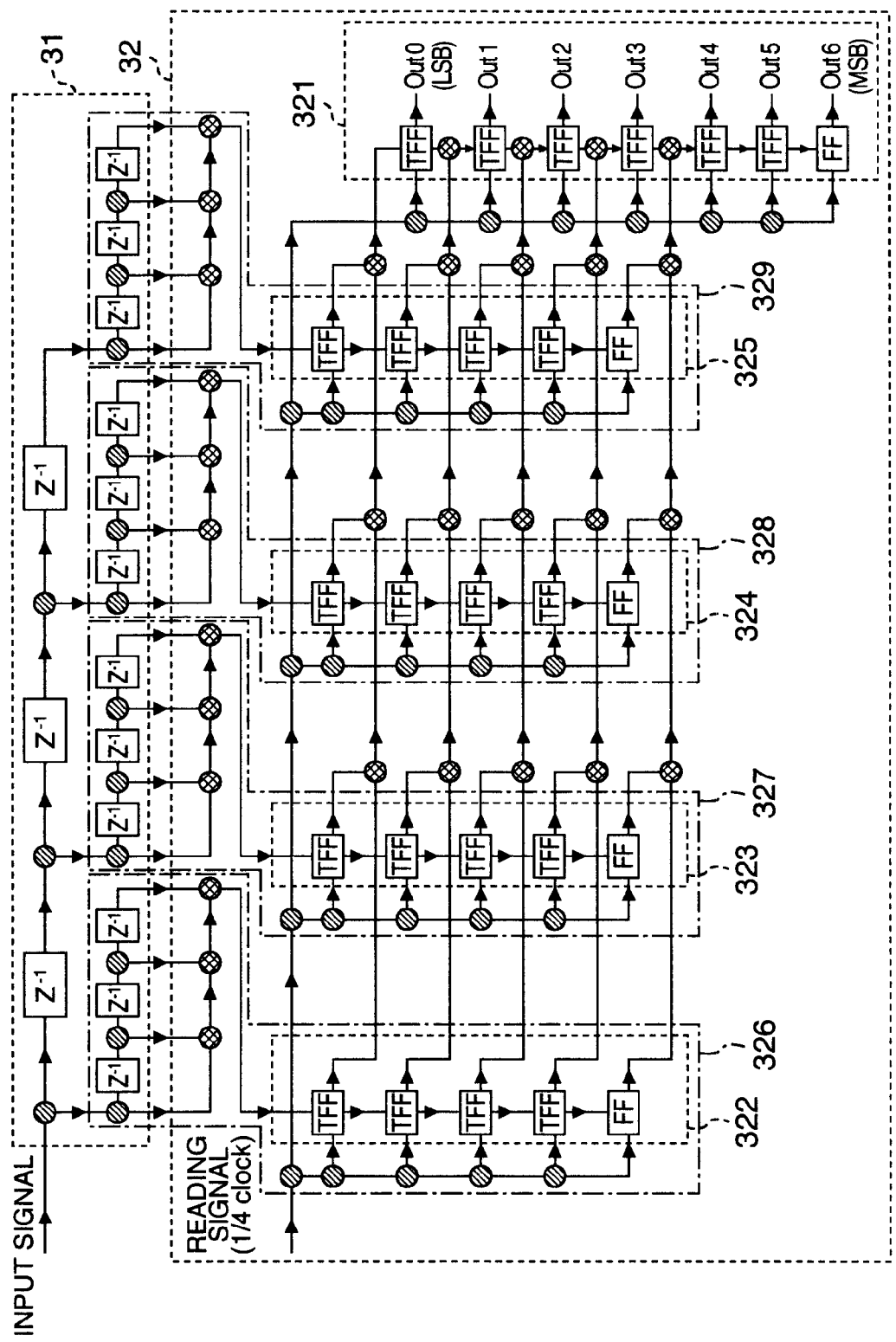
FIG. 3 is a circuit diagram showing constitution of a third embodiment of a decimation filter, i.e., a third order sinc filter with decimation factor N=4 in accordance with the present invention.

Referring next to FIG. 3, description will be given of a third embodiment of the present invention.

The third embodiment is an alternative example of a third order sinc filter with decimation factor N=4. This embodiment is implemented by modifying the second embodiment as follows. Namely, part of confluence buffers are replaced with counters 322 to 325 and a counter 321 is additionally disposed to add count values respective from these counters.

The third embodiment includes a first circuit block 31 equal in configuration to first circuit block 21 of the second embodiment. Having received input pulse $x_i$, first circuit block 31 generates 16 pulses each having a delay of an integral multiple of the clock relative to input signal pulse $x_i$, namely, $\{x_j\}$, $\{x_{j-1}\}$, $\{x_{j-2}\}$, $\{x_{j-3}\}$, $\{x_{j-1}\}$, $\{x_{j-2}\}$, $\{x_{j-3}\}$, $\{x_{j-4}\}$, $\{x_{j-2}\}$, $\{x_{j-3}\}$, $\{x_{j-4}\}$, $\{x_{j-5}\}$, $\{x_{j-3}\}$, $\{x_{j-4}\}$, $\{x_{j-5}\}$, and $\{x_{j-6}\}$.

A second circuit block 32 counts these pulses. First, pulses $\{x_j\}$, $\{x_{j-1}\}$, $\{x_{j-2}\}$, and $\{x_{j-3}\}$ are merged by confluence buffers to count by a counter 322 the number of pulses during a period of time which is four times that of the clock. Namely, the number of pulses is obtained from j=i−3 to j=i as follows.

$$\sum_{j=i-3}^{i} (x_j + x_{j-1} + x_{j-2} + x_{j-3}) \quad (6)$$

Similarly, pulses $\{x_{j-1}\}$, $\{x_{j-2}\}$, $\{x_{j-3}\}$, and $\{x_{j-4}\}$ are merged by confluence buffers to count by a counter 323 the number of pulses during a period of time which is four times that of the clock. The number of pulses is obtained in a range from j=i−3 to j=i as follows.

$$\sum_{j=i-3}^{i} (x_{j-1} + x_{j-2} + x_{j-3} + x_{j-4}) \quad (7)$$

In a similar way, the number of subsequent pulses is measured by a counter 324 in a range from j=i−3 to j=i according to expressions (8). Moreover, the number of further subsequent pulses is counted by a counter 325 from j=i−3 to j=i according to expression (9) below.

$$\sum_{j=i-3}^{i} (x_{j-2} + x_{j-3} + x_{j-4} + x_{j-5}) \quad (8)$$

$$\sum_{j=i-3}^{i} (x_{j-3} + x_{j-4} + x_{j-5} + x_{j-6}) \quad (9)$$

Subsequently, the count results respectively from counters 322 to 325 are fed to counter 321.

As a result, 16 pulses generated from first circuit block 31 during a period of time which is four times that of the clock are counted. Namely, the number of pulses from j=i−3 to j=i is attained as $y_i$ through a filter operation.

Although the third embodiment uses counter 321 to add the count results from the respective counters, there may be used an adder for a logic operation circuit to obtain a similar result.

Circuit blocks 326 to 329 respectively enclosed with dot-and-dash lines are second order sinc filters with N=4. Each of the filters is equal in configuration to the decimation filter of the first embodiment. Therefore, the third embodiment includes the second order sinc filters connected via delays to each other.

Fourth Embodiment

Figure 4:
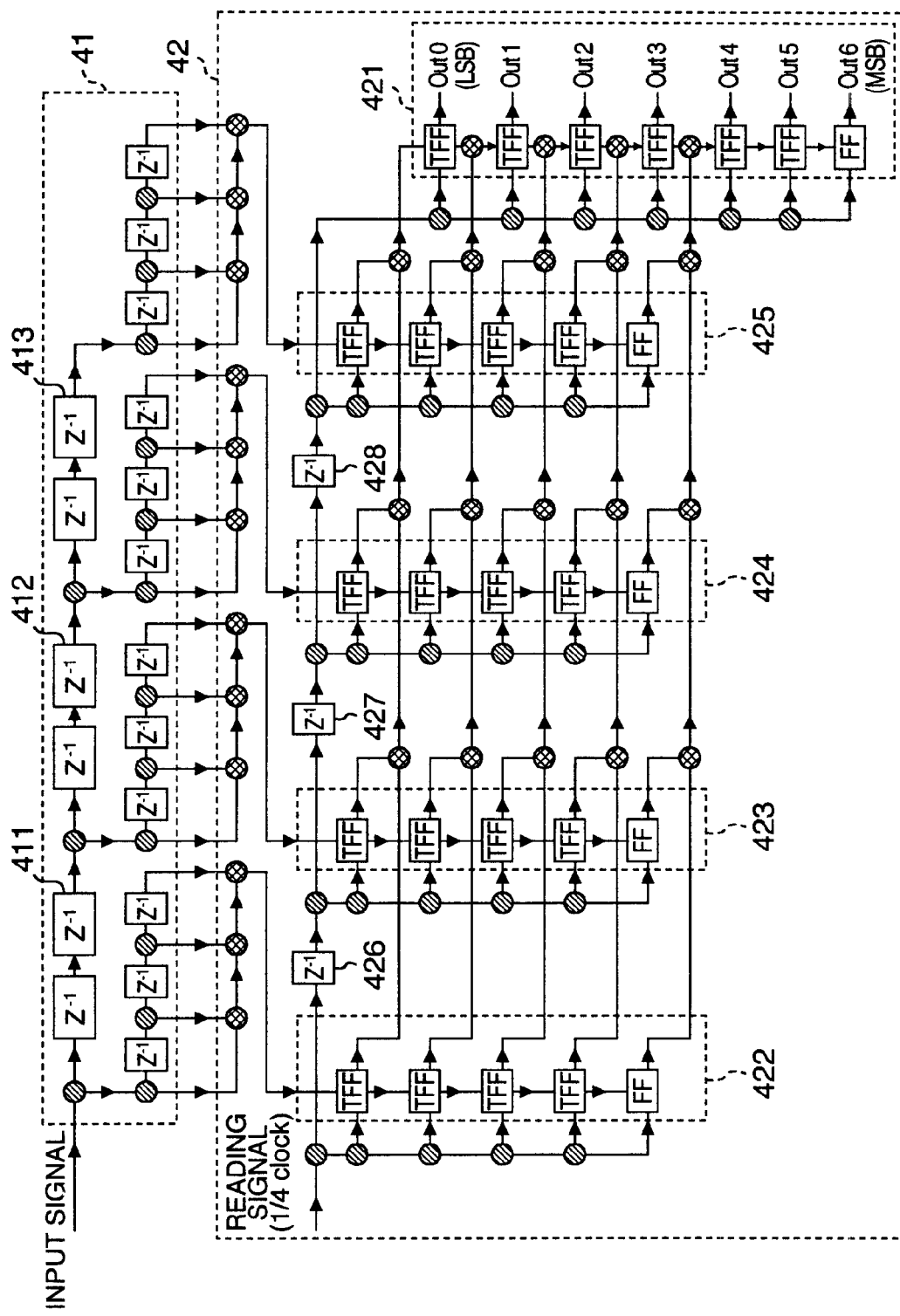
FIG. 4 is a circuit diagram showing constitution of a fourth embodiment of a decimation filter, i.e., a third order sinc filter with decimation factor N=4 in accordance with the present invention.

Referring now to FIG. 4, description will be given of a fourth embodiment of the present invention. This embodiment is a further alternative example of a third order sinc filter with decimation factor N=4. The fourth embodiment is implemented by modifying the third embodiment such that delay units 411 to 413 are added to the first circuit block and delay units 426 to 428 are correspondingly added to the second circuit block. This configuration reduces the amount of operation to be executed during one clock to achieve a high-speed operation.

First circuit block 41 is obtained by adding delay units 411 to 413 to the first circuit block of the third embodiment. Since transmission of the pulse is delayed one clock by each delay unit, first circuit block 41 generates 16 pulses $\{x_j\}$, $\{x_{j-1}\}$, $\{x_{j-2}\}$, $\{x_{j-3}\}$, $\{x_{j-2}\}$, $\{x_{j-3}\}$, $\{x_{j-4}\}$, $\{x_{j-5}\}$, $\{x_{j-4}\}$, $\{x_{j-5}\}$, $\{x_{j-6}\}$, $\{x_{j-7}\}$, $\{x_{j-6}\}$, $\{x_{j-7}\}$, $\{x_{j-8}\}$, and $\{x_{j-9}\}$.

Second circuit block 42 counts these pulses.

Pulses $\{x_j\}$, $\{x_{j-1}\}$, $\{x_{j-2}\}$, and $\{x_{j-3}\}$ are first merged by confluence buffers to count by a counter 422 the number of pulses during a period of time which is four times that of the clock. Namely, the number of pulses is counted from j=i−3 to j=i, and Expression (6) is obtained.

Similarly, Pulses $\{x_{j-2}\}$, $\{x_{j-3}\}$, $\{x_{j-4}\}$, and $\{x_{j-5}\}$ are merged by confluence buffers so as to count by a counter 423 the number of pulses during a period of time which is four times that of the clock.

However, delay unit 426 is disposed in a signal line to transfer a reading signal in association with delay unit 411 inserted in first circuit block 41, the time to read out the pulse signals is delayed one clock. The number of pulses from j=i−2 to j=i+1 is therefore counted as follows.

$$\sum_{j=i-2}^{i+1} (x_{j-2} + x_{j-3} + x_{j-4} + x_{j-5}) \quad (10)$$

(expresssion (7))

Similarly, counter 424 counts the number of subsequent pulses as follows.

$$\sum_{j=i-1}^{i+2} (x_{j-4} + x_{j-5} + x_{j-6} + x_{j-7}) \quad (11)$$

(expresssion (8))

In a similar way, counter 425 counts the number of further subsequent pulses as follows.

$$\sum_{j=i}^{i+3} (x_{j-6} + x_{j-7} + x_{j-8} + x_{j-9}) \quad (12)$$

(expresssion (9))

The count results from counters 422 to 425 are fed to counter 421 at appropriate timing. The number of pulses is counted, i.e., 16 pulses generated from first circuit block 41 during the period of time which is four times that of the clock are counted to obtain $y_i$ through a filter operation.

In the fourth embodiment, the pulses generated from first circuit block 41 are not simultaneously counted, but are respectively delayed one clock by delay units 426 to 428 to be thereafter counted. Therefore, the desired value of $y_i$ is attained three clocks after the reading signal is inputted. Although the filter produces an output signal three clocks after the input of the reading signal, the amount of operation during the period of one clock is reduced and hence the operation speed can be much more increased.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A decimation filter, comprising:
   delay units for sequentially delaying an input signal one clock and for producing a plurality of delayed signals;

adders for sequentially adding the delayed signals to each other and for producing total signals; and a counter connected to outputs from said adders for counting pulses of the total signals from said adders.

2. A decimation filter according to claim 1, wherein said adders include confluence buffers connected in series to each other for merging a plurality of signal lines into one signal line.

3. A decimation filter according to claim 1, wherein said counter counts pulses of the total signals during a period of time which is an integral multiple of a period of one clock signal.

4. A decimation filter according to claim 1, wherein said counter includes a plurality of frequency multiplier (×12) circuits connected in series to each other.

5. A decimation filter according to claim 4, wherein said counter produces a count value according to a reading signal inputted thereto during a period of time which is an integral multiple of a period of a clock signal and is thereby set to a reset state.

6. A decimation filter according to claim 5, wherein:

said counter includes a plurality of counting circuit groups;

said decimation filter further includes a plurality of second delay circuits for sequentially delaying one clock period the reading signal to read count values from said counting circuit groups;

said delay units include a plurality of third delay circuits for delaying the input signal corresponding to the delay signals, respectfully.

7. A decimation filter according to claim 6, wherein each of said adders, said counters, and said delay units includes a plurality of superconductive circuits.

8. A decimation filter according to claim 1, wherein each of said adders, said counters, and said delay units includes a plurality of superconductive circuits.

9. A signal processing method for use with a decimation filter, comprising the steps of:

sequentially delaying an input signal one clock and for producing a plurality of delayed signals;

sequentially adding with adders the delayed signals to each other and for producing total signals; and counting pulses of the total signals from said adders.

10. A signal processing method according to claim 9, wherein said adding step includes a plurality of merging steps for merging a plurality of signal lines into one signal line.

11. A signal processing method according to claim 10, wherein said counting step includes counting signals during a period of time which is an integral multiple of a period of a clock signal.

12. A signal processing method according to claim 9, wherein said counting step a plurality of steps for multiplying a frequency by 1/2.

13. A signal processing method according to claim 12, wherein said counting step includes producing by a counter a count value according to a reading signal inputted thereto during a period of time which is an integral multiple of a period of a clock signal and setting the counter to a reset state.

14. A decimation filter, comprising:

a first block for sequentially delaying an input signal one clock and for producing a plurality of delayed signals;

adders for sequentially adding the delayed signals to each other and for producing total signals; and a second block connected to outputs of said adders for counting pulses of the total signals from said adders.

15. A decimation filter according to claim 14, wherein said adders include confluence buffers connected in series to each other for merging a plurality of signal lines into one signal line.

16. A decimation filter according to claim 15, wherein said second block counts pulses of the total signals during a period of time which is an integral multiple of a period of a clock signal.

* * * * *